United States Patent
Gomez et al.

(10) Patent No.: US 9,076,530 B2
(45) Date of Patent: Jul. 7, 2015

(54) NON-VOLATILE WRITE BUFFER DATA RETENTION PENDING SCHEDULED VERIFICATION

(71) Applicant: Seagate Technology LLC, Cupertino, CA (US)

(72) Inventors: Kevin Arthur Gomez, Eden Prairie, MN (US); Ryan James Goss, Prior Lake, MN (US); Antoine Khoueir, Apple Valley, MN (US); David Scott Ebsen, Minnetonka, MN (US); Jon D. Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 124 days.

(21) Appl. No.: 13/762,033

(22) Filed: Feb. 7, 2013

(65) Prior Publication Data

US 2014/0219034 A1    Aug. 7, 2014

(51) Int. Cl.
*G11C 16/06* (2006.01)
*G11C 16/22* (2006.01)
*G11C 11/16* (2006.01)
*G11C 13/00* (2006.01)

(52) U.S. Cl.
CPC ............. *G11C 16/06* (2013.01); *G11C 16/22* (2013.01); *G11C 11/16* (2013.01); *G11C 13/0004* (2013.01); *G11C 13/0007* (2013.01); *G11C 13/0064* (2013.01); *G11C 13/0069* (2013.01); *G11C 2207/2245* (2013.01)

(58) Field of Classification Search
CPC .............. G11C 16/3454; G11C 16/16

USPC .......................... 365/185.22, 185.33
See application file for complete search history.

(56) References Cited

U.S. PATENT DOCUMENTS

| | | | |
|---|---|---|---|
| 6,011,720 | A | 1/2000 | Tanaka |
| 7,620,773 | B2 | 11/2009 | Nicholson et al. |
| 8,214,700 | B2 | 7/2012 | Chen |
| 2002/0029354 | A1 | 3/2002 | Forehand et al. |
| 2004/0128414 | A1 | 7/2004 | Rudelic |
| 2006/0149902 | A1 | 7/2006 | Yun et al. |
| 2009/0003115 | A1* | 1/2009 | Lindahl et al. ............. 365/227 |
| 2009/0161453 | A1 | 6/2009 | Giovannini et al. |
| 2013/0297855 | A1* | 11/2013 | Gupta et al. .............. 711/103 |

FOREIGN PATENT DOCUMENTS

| | | |
|---|---|---|
| EP | 1488429 | 12/2004 |
| EP | 1901306 A1 | 3/2008 |
| JP | 2005-301591 A | 10/2005 |
| JP | 2005-346898 A | 12/2005 |
| JP | 2009-043397 A | 2/2009 |
| JP | 2009-252294 A | 10/2009 |
| WO | 2007/105688 A1 | 9/2007 |

* cited by examiner

*Primary Examiner* — Huan Hoang
(74) *Attorney, Agent, or Firm* — Hall Estill Attorneys at Law (57) ABSTRACT

Method and apparatus for managing data in a memory. In accordance with some embodiments, a non-volatile (NV) buffer is adapted to store input write data having a selected logical address. A write circuit is adapted to transfer a copy of the input write data to an NV main memory while retaining the stored input write data in the NV buffer. A verify circuit is adapted to perform a verify operation at the conclusion of a predetermined elapsed time interval to verify successful transfer of the copy of the input write data to the NV main memory. The input write data are retained in the NV buffer until successful transfer is verified.

25 Claims, 5 Drawing Sheets

NON-VOLATILE WRITE BUFFER DATA RETENTION PENDING SCHEDULED VERIFICATION

SUMMARY

Various embodiments of the present disclosure are generally directed to managing data in a data storage device.

In accordance with some embodiments, a non-volatile (NV) buffer is adapted to store input write data having a selected logical address. A write circuit is adapted to transfer a copy of the input write data to an NV main memory while retaining the stored input write data in the NV buffer. A verify circuit is adapted to perform a verify operation at the conclusion of a predetermined elapsed time interval to verify successful transfer of the copy of the input write data to the NV main memory.

These and other features and aspects which characterize various embodiments of the present invention can be understood in view of the following detailed discussion and the accompanying drawings.

DETAILED DESCRIPTION

The present disclosure generally relates to the management of data in a data storage device.

Non-volatile (NV) memories tend to store data in such a way that the stored data persist in the memory without the need for refresh operations to maintain the data state, such as after power is removed from the memory device.

A write verify operation (sometimes referred to as a write/read verify operation or simply a verify operation) can be carried out to ensure data have been successfully written to anon-volatile memory during a write operation.

Generally, a verify operation can entail temporarily buffering the data in a local buffer memory, writing the data to a main memory so that the data are copied over from the local buffer to the main memory, reading a set of data from the main memory, and comparing the data read back from the main memory with the original set of data in the local buffer. If the two sets of data match, the write operation can be verified as having been successful, and the original set of data in the local buffer can be jettisoned or otherwise discarded to make room for other data.

If a power outage or other disturbance event occurs prior to the completion of the verify operation, or if the data are corrupted or jettisoned from the local buffer prior to the verify operation, the data may be lost if the write operation was unsuccessful. Because of these risks, it is common to employ a non-volatile (NV) local buffer to temporarily store high priority write data prior to transferring the data to an NV main memory.

Buffering the input data in an NV buffer essentially ensures that the data are always stored in NV memory, which tends to reduce the risk of data loss. Moreover, buffering the input data in an NV buffer allows a command complete status to be safely issued to the host device as soon as the data are received by the host, allowing the subsequent write operation to move the data to the NV main memory to be carried out at a more opportune time instead of requiring the write operation to be immediately serviced.

While operable, there remains a continued need for improvements in the manner in which write data are transferred to an NV main memory. Accordingly, various embodiments of the present disclosure are generally directed to enhancing data integrity and system reliability in a data storage system.

As explained below, various embodiments generally employ an NV main memory, such as a flash memory, to which user data from a host device are stored. An NV write buffer is used to temporarily buffer write data pending transfer to the main memory. The NV write buffer may take a non-flash NV construction such as magnetic random access memory (MRAM), spin-torque transfer random access memory (STRAM), resistive random access memory (RRAM), phase change random access memory (PCRAM), etc.

Incoming write data are stored in the NV write buffer, and a write operation is scheduled and performed to copy the write data from the NV buffer to the NV main memory. Once the data have been transferred to the NV main memory, a predetermined elapsed time interval is initiated.

In one approach, the predetermined elapsed time interval may be established through the use of a timer circuit that initiates the time interval and signals its completion once a selected amount of time has passed (e.g., 30 seconds, etc.). In another approach, the predetermined elapsed time interval is measured in terms of a count of subsequent access commands (e.g., read and/or write commands) so that a selected number of X access commands (e.g., 10 commands, etc.) are received to denote the time interval. In this latter case, the measured time that passes during the interval will vary in relation to device workload.

At the conclusion of the elapsed time interval, if no intervening updated write requests have been received for the associated data, a verify operation is carried out to verify the data have been successfully written to the NV main memory. If the write operation was successful, the data in the NV buffer can be jettisoned to free up space for other data. If the verify operation was unsuccessful, another write operation can be carried out, or other corrective actions can be taken.

If an intervening write request is received during the elapsed time interval, the system can check to see if the new write request provides an updated set of the write data. If so, the scheduled verify operation for the previously received set of data can be cancelled, and the foregoing process can be restarted for the new write data.

If an intervening read request is received during the time interval for the pending write data, the read request can be quickly serviced from the NV buffer as a cache hit. The occurrence of intervening read and/or write requests can initiate a number of post processing activities, such as changes in cache strategy, write amplification mitigation, the use of fast ("sloppy") writes, etc.

Figure 1:
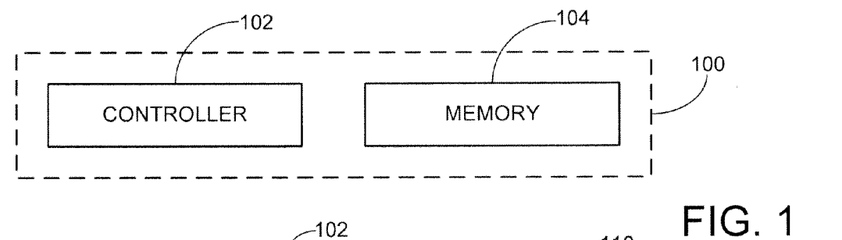
FIG. 1 provides is a functional block representation of a data storage device in accordance with various embodiments of the present disclosure.

These and other features and advantages of various embodiments can be understood beginning with a review of FIG. 1 which provides a data storage device 100 constructed and operated in accordance with various embodiments. The data storage device 100 generally includes a controller 102 and a memory module 104. The controller 102 provides top level control of the device 100. The memory module 104 stores and retrieves user data from/to a requestor entity, such as an external host device (not separately shown). In some embodiments, the controller functionality can be incorporated into the memory module 104 so that a separate controller is unnecessary.

For purposes of providing a concrete example, the system 100 is contemplated as a flash memory based storage device, such as a solid state drive (SSD), a portable thumb drive, a memory stick, a memory card, etc. It will be appreciated that this is merely illustrative and not limiting, as the memory module 104 can alternatively incorporate any number of different types of non-volatile memory.

Figure 2:
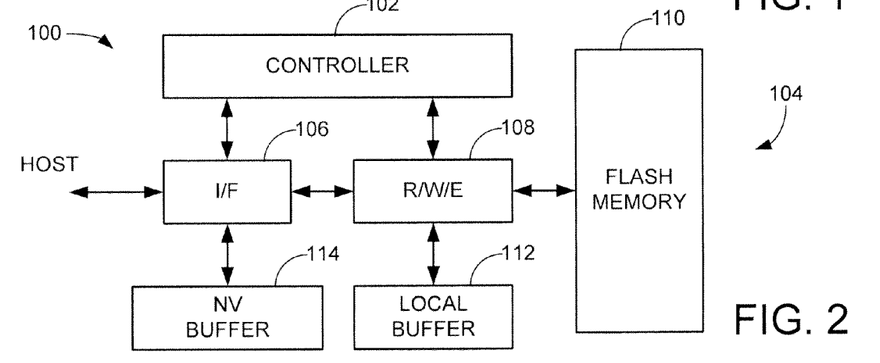
FIG. 2 illustrates aspects of the device of FIG. 1 in accordance with some embodiments.

FIG. 2 illustrates portions of the device 100 of FIG. 1 in accordance with some embodiments. The controller 102 is depicted as a programmable processor having suitable programming stored in local memory to direct data transfer operations with a host device. The memory module 104 includes an interface (I/F) circuit 106, a read/write/erase (R/W/E) channel 108, a flash memory array 110, a local volatile buffer 112, and a non-volatile (NV) buffer 114.

The I/F circuit 106 provides primary interface communications with the host to receive and transmit commands, status control information and data. The R/W/E channel 108 includes suitable row and column drivers and other decoding circuit to encode, write and read back data from the flash memory array 110. The channel 108 carries out other operations under the direction of the controller 102 as well such as garbage collection, cache management and verify operations.

The local buffer 112 may take the form of dynamic random access memory (DRAM) or similar construction and stores user data and metadata associated with the flash memory 110. The metadata may be stored in the flash memory array 110 and transferred to the local buffer 112 as necessary to support various access (read and write) operations.

The NV buffer temporarily stores write data pending verify operations upon data copied over to the flash memory 110, as discussed below. It is contemplated that the NV buffer 112 is rewriteable so that data may be written to the buffer and then overwritten as required.

Figure 3:
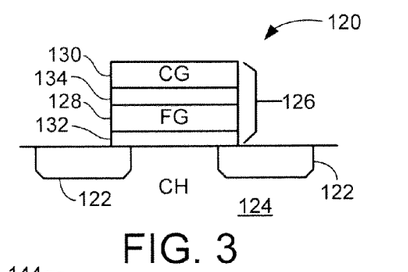
FIG. 3 depicts a flash memory cell from the flash memory of FIG. 2.

FIG. 3 depicts a flash memory cell 120 from the flash memory array 110. Doped regions 122 in a semiconductor substrate 124 form source and drain regions spanned by a gate structure 126. The gate structure includes a floating gate (FG) 128 and a control gate (CG) 130 separated by intervening barrier layers 132, 134. Data are stored to the cell 120 in relation to the accumulation of electrical charge on the floating gate 128.

Figure 4:
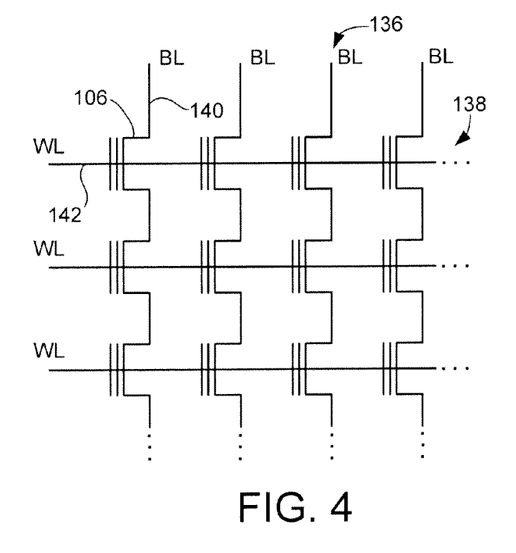
FIG. 4 schematically represents a portion of an array of flash memory cells in accordance with some embodiments.

FIG. 4 shows a plurality of the cells 120 arranged into columns 136 and rows 138. The cells 120 in each column 136 are interconnected in a NAND configuration and are accessed by a separate bit line (BL) 140. The cells 120 along each row 138 are connected to a separate word line (WL) 142 which interconnects the control gate (GC) 130 of each cell along the associated row.

The cells are written (programmed) by applying suitable voltages to the bit lines 140 and word lines 142 to migrate charge from the channel to the respective floating gates 128. The presence of charge on the floating gate 128 of a cell 120 increases the threshold voltage that needs to be placed on the control gate 130 to place the cell in a drain-source conductive state. The programmed states are read (sensed) by applying a succession of voltages to the respective bit lines 140 and word lines 142 to detect the threshold at which the cells are transitioned to a conductive state.

Figure 5:
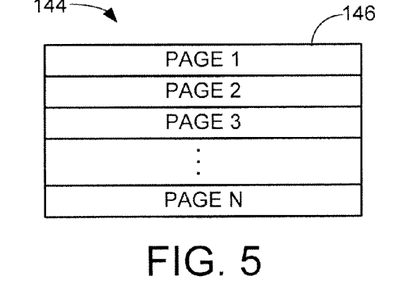
FIG. 5 depicts an erasure block of the flash memory array of FIG. 2.

A special erasure operation is required to remove the accumulated charge and return the cell 120 to an unerased, initialized state. FIG. 5 depicts an erasure block 144 formed from memory cells 120 as set forth by FIG. 4. The erasure block 144 represents the smallest grouping of memory cells that can be subjected to an erasure operation at a time.

The data are stored in the form of pages 146. The erasure block 144 has a total of N pages, with each page storing a selected amount of data (e.g., 4096 bits, etc.). The pages 146 correspond to the rows 136 of memory cells; in single level cell (SLC) recording, each cell 120 along a selected row stores a single page worth of data. In multi-level cell (MLC) recording, each cell 120 along a selected row stores two (or more) pages worth of data. Generally, each cell can store up to N bits of data by providing 2 distinct accumulated charge levels.

Because data cannot normally be overwritten to a group of flash memory cells 120 without first subjecting the cells to an erasure operation, each set of data associated with a selected logical address (e.g., a logical block address, LBA, etc.) is normally written to a new location in the array. For example, a data block identified as LBA X may be written to Page 1 in FIG. 5. If a subsequently presented version of the data block LBA X is provided for writing, it may be written to a new location (e.g., Page 3, etc.). Generally, a next available location in the array 110 is selected to write each new version of a given LBA. The next available location may be in the same erasure block 144, or more likely, in a more recently allocated erasure block 144.

The metadata is maintained by the device 100 to track the locations of the various versions of each LBA. The metadata may include a series of forward pointers to manage the location of the most current version of each LBA. Prior versions may be marked as stale. When sufficient levels of data are stale in an erasure block or in a larger garbage collection unit (GCU) made up of a number of such blocks, the erasure block or GCU can be subjected to a garbage collection process whereby current version data are migrated to a new location, the erasure block or GCU is erased, and the erased block or GCU is returned to an allocation pool pending allocation for subsequent use in storing user data.

As noted above, the NV buffer 114 in FIG. 2 is used to temporarily buffer input write data to be written to one or more pages 146 in the array 110. Albeit not required, it is contemplated that the NV buffer 114 will use a different type of solid-state non-volatile memory cell construction. A variety of constructions can be used, such as but not limited to those set forth by FIGS. 6-8.

Figure 6:
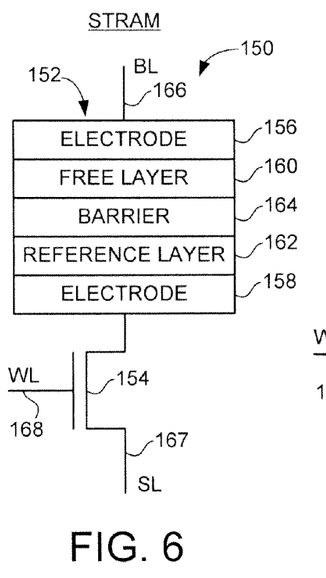
FIG. 6 represents a spin-torque transfer random access memory (STRAM) cell useful in the non-volatile (NV) write buffer of FIG. 2.

FIG. 6 depicts a memory cell 150 having a spin-torque transfer random access memory (STRAM) configuration. The memory cell includes a magnetic tunneling junction (MTJ) 152 in series with a switching device 154. The switching device 154 is shown to constitute a metal oxide semiconductor field effect transistor (MOSFET), although other forms of switching devices can be used including unidirectional devices such as diodes, etc.

The MTJ 152 includes top and bottom conductive electrodes 156 and 158, a free layer 160, a reference layer 162 and an intervening barrier layer 164. Other MTJ configurations can be used. The free layer 160 comprises one or more layers of magnetically responsive material with a variable magnetic orientation. The reference layer comprises one or more layers of magnetically responsive material with a fixed magnetic orientation. The reference layer may include a pinning layer, such as a permanent magnet, a synthetic antiferromagnetic (SAF) layer, etc., and a pinned layer, such as a ferromagnetic layer oriented magnetically by the pinning layer. The direction(s) of the magnetic orientation may be perpendicular or parallel to the direction of current through the MTJ 152.

The MTJ exhibits different electrical resistances in relation to the orientation of the free layer 160 relative to the reference layer 162. A relatively low resistance is provided in a parallel orientation, where the free layer 160 is oriented in the same direction as the reference layer 162. A relatively high resistance is provided in an anti-parallel orientation, where the free layer 160 is oriented in the opposing direction as the reference layer 162. Spin torque currents can be applied to transition the free layer between the parallel and anti-parallel orientations.

The memory cell 150 is interconnected by a plurality of control lines, including a bit line (BL) 166, a source line (SL) 167 and a word line (WL) 168. The word line 168 operates as a select line, enabling current to pass through the MTJ 152 between the bit line 166 and the source line 167 in the desired direction.

Figure 7:
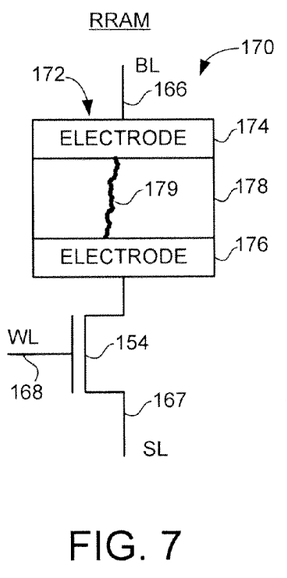
FIG. 7 illustrates a resistive random access memory (RRAM) cell useful in the non-volatile (NV) write buffer of FIG. 2.

FIG. 7 provides a resistive random access memory (RRAM) cell 170. The cell 170 includes an RRAM programmable element 172 in combination with the switching device 154 from FIG. 6. Top and bottom conductive electrodes 174, 176 separate an intervening layer that may constitute an oxide layer or electrolytic layer. The intervening layer 178 normally has a relatively high electrical resistance.

During a programming operation, ionic migration is initiated which may result in the formation of a filament 179 that lowers the electrical resistance through the RRAM element 172. The filament 179 is formed by applying a programming current sequence to the respective word, bit and source lines 166, 167 and 168. The RRAM cell 170 can be reset to its initial state by applying a different combination of voltages to the cell. Other RRAM configurations are contemplated that do not necessarily form a conductive filament, such as structures that undergo a change of state by the migration of ions or holes across a barrier or to an intermediate structure that results in a controlled change in resistance for the element 182.

Figure 8:
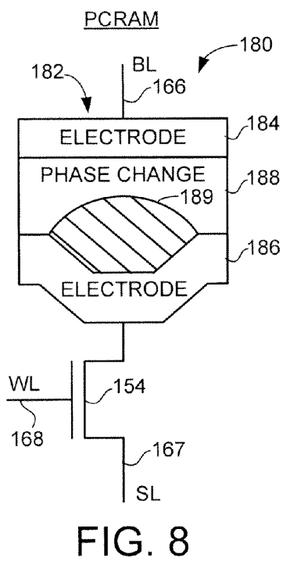
FIG. 8 depicts a phase change random access memory PCRAM) cell useful in the non-volatile (NV) write buffer of FIG. 2.

FIG. 8 depicts a phase change random access memory (PCRAM) cell 180. As before, the cell 180 has a programmable element 182 in series with the switching device 154 from FIGS. 6-7. Top and bottom electrodes 184, 186 separate a phase change material 188. The phase change material is heat responsive and transitions (melts) when heated to a temperature at or above its glass transition temperature. Depending on the rate at which the layer 188 is subsequently cooled, at least a portion of the material can take an amorphous or crystalline state, with respective higher and lower resistances. FIG. 8 shows an amorphous zone 189 indicating the cell 180 is programmed to the high resistance state.

Figure 9:
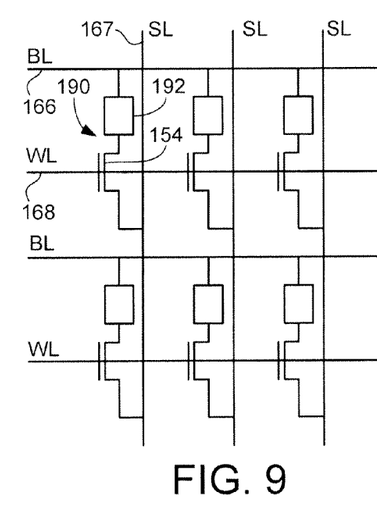
FIG. 9 is a schematic representation of an arrangement of rewriteable non-volatile memory cells of the NV buffer in accordance with some embodiments.

It will be appreciated that other forms of non-volatile solid-state memory cells can be utilized apart from those exemplified in FIGS. 6-8. FIG. 9 shows the general use of NV memory cells 190 each having a resistive sense element (RSE) 192, which may correspond to a selected one of the elements 152, 172 and 182 in FIGS. 6-8, in combination with a switching device such as the device 154. The cells are arranged into rows and columns and interconnected via the aforementioned bit, source and word lines 166, 167 and 168.

Although not required, it is contemplated that the NV buffer 114 in FIG. 2 will take a construction such as set forth in FIG. 9. The NV buffer 114 will be rewritable in nature so that each set of cells along each word line 168 can be arranged to store data pending transfer to the main flash memory 110, and then overwritten with new data as required without the need to subject the memory to an erasure operation.

Figure 10:
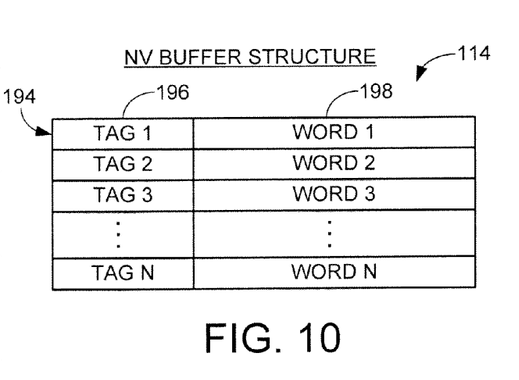
FIG. 10 provides an exemplary format for the NV buffer using rewriteable memory cells as arranged in FIG. 9.

The NV buffer 114 may have a faster data I/O rate than the flash memory 110, so that data can be quickly written to and read out of the NV buffer 114 as required to support access operations with the flash memory. The NV buffer 114 may be arranged in the form of a content addressable memory (CAM) or similar cache structure. FIG. 10 shows an exemplary CAM structure for the NV buffer 114. The CAM structure can store up to N entries 194. Each entry includes an identifier tag in a tag field 196 and a word payload in a word field 198. The identifier tags may be LBA addresses, and the word payloads may be corresponding page data associated with the LBA address.

Figure 11:
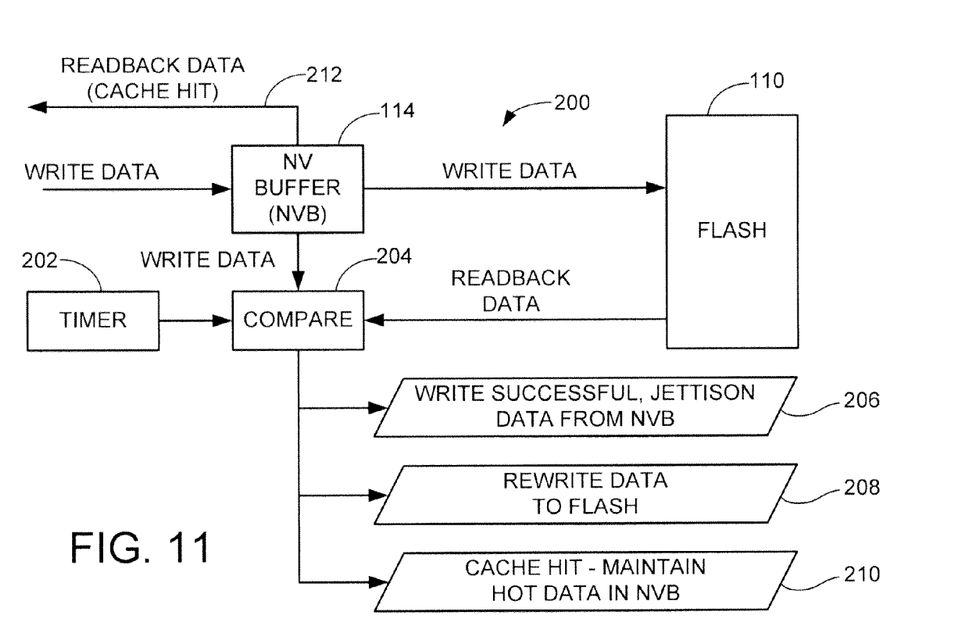
FIG. 11 illustrates an exemplary verify operation carried out by the device of FIG. 2 in accordance with some embodiments.

FIG. 11 illustrates aspects of a data write management circuit 200 of the present disclosure. The circuit 200 can be incorporated into various aspects of the memory module 104 discussed above to carry out verify and other related operations. For purposes of the present discussion, it will be contemplated that a set of write data is presented to the device 100 from the host for writing to the main flash memory array 110. The write data are provided with a selected logical block address, e.g., LBA 1001. In practice, it will be appreciated that a single write request (write command) can be issued that involves the writing of many LBAs worth of data to the flash memory.

As shown in FIG. 11, the write data received from the host are temporarily stored in an available entry 194 (FIG. 10) of the NV buffer 114, and a copy of the input write data is written to a next available page 146 (FIG. 5) of the flash memory array 110. These steps are carried out as discussed above and include using the LBA number (100)) as the tag entry in field 196 and the user data in word field 198 for the associated entry. Encoding may be applied prior to or subsequent to the loading of the write data to the NV buffer 114. The writing of the data to the flash memory array 110 include referencing the metadata to identify a physical address (e.g., page, etc.) to which the data are to be written, and to apply the appropriate encoding or other processing to the data to store the data. The data will be stored to a selected row 138 of the flash memory cells 120 in relation to the amount of accumulated charge on the associated floating gates 128 of the cells.

Once the data have been written, a timer circuit 202 initiates a count for a predetermined elapsed time interval. The length of the interval can be any suitable value, and may be on the order of a few seconds (e.g., 3-5 seconds, etc.) or more. Other durations can be selected, including different durations for different priority levels of data. The duration(s) can further be adaptively changed during operation based on operational loading of the device 100. The data management circuit 200 further schedules a verify operation to be carried out at the conclusion of the elapsed time interval.

In some embodiments, the length of the interval in terms of the passage of elapsed time can be selected to exceed a relax time of the main memory (e.g., flash 110). It will be recognized that writing data to a flash memory involves the transfer of charge to the floating gate structure of the memory, and upon completion of the transfer of charge, there is a relatively short duration of time during which the flash cell stabilizes to a final accumulated charge state. This time interval, which may be about 30 seconds in duration or more for current generation flash memory cells, is referred to herein as the relax time. Other constructions of memory cells may have different associated relax times. By selecting the duration of the elapsed time interval to exceed the relax time, the verify operation can be carried out at a point in time after the final programmed state of the cell has been stabilized.

In other embodiments, the tinier circuit can count access commands (e.g., read and/or write commands) as a metric in lieu of the passage of time. In other words, the predetermined time interval may be defined in relation to receipt of X new access commands from a host device, so that the verify operation is not carried out until the X commands have been received (and, in some cases, serviced). The number X can be any plural integer, such as 10, 20, 50, etc. It will be appreciated that the actual amount of elapsed time that passes during the interval in this case will vary based on workload; in a higher workload environment where a relatively higher number of I/O access commands are serviced, the actual total amount of time that passes during the interval will be shorter than in a lower workload environment having a relatively lower number of I/O access commands.

During the time interval, the device 100 operates in a normal operational mode and services additional access requests as required. Once the timer circuit 202 signals the end of the elapsed time interval, the scheduled verify operation commences (except as discussed below). The R/W/E channel 108 reads back the write data from the flash memory array 110 that was written at the beginning of the time interval. The readback data may be temporarily stored in the local buffer 112 or some other suitable location, including the NV buffer as desired. If encoding was applied to the data during the write operation, suitable decoding is applied (e.g., error detection and correction, etc.) so that the data are nominally in the same state as the write data still pending in the NV buffer 114.

A comparison circuit 204 compares the original write data in the NV buffer 114 with the readback data using any number of known techniques, including application of an exclusive-or (XOR) operation.

A number of different processing paths are depicted in FIG. 11 depending on the results of the verify operation, as well as on whether additional events occurred during the elapsed time interval.

If the comparison circuit 204 determines that the two data sets match, the write operation is verified as having been successful and the write data are thereafter removed (jettisoned) from the NV buffer 112, as depicted at step 206. It will be appreciated that if there are available cache lines 194 in the NV buffer 112, the data may not necessarily be immediately removed or overwritten, but instead may be selected to be overwritten when the cache line is subsequently required to accommodate new data. Leaving the write data in the NV buffer adds essentially no processing cost and may enable subsequent read cache hits in the interim.

If the comparison circuit 204 determines that the two data sets do not match, then an error is presumed to have occurred and corrective actions are taken as indicated by step 208. The corrective actions may include rewriting the data to a new location in the flash memory array 110 and repeating the above steps. The failure may be due to a defect or other anomalous condition in the flash memory, so other steps may be taken as well. For example, the location to which the data are written may be evaluated for possible deallocation, etc.

FIG. 11 shows an additional processing path at 210, indicative of a situation where a read request from the host device is received by the device 100 for the write data stored in the NV buffer 114 (e.g., LBA 1001). If so, a copy of the write data are output as readback data from the NV buffer 114 as denoted by path 211. This constitutes a cache hit.

The fact that a read request was immediately received for the data further leads to a classification of the data as "hot" data, that is, data in which the host is presently demonstrating a relatively high level of interest. Accordingly, the hot write data for LBA 1001 are maintained in the NV buffer 114 in anticipation of subsequent cache hits. As will be appreciated, a cache hit is generally desirable since the associated read request can be satisfied without the need to read the data out of the flash memory array 110, thereby saving time and system resources.

Other steps may be taken as well at this point, such as migrating other data spatially or temporally related to the write data for LBA 1001 to the NV buffer 114 as a speculative read operation to further support potential cache hits. Spatially (space) related data may be nearby LBAs in the LBA sequence (e.g., LBAs 1002, 1003, etc.). Temporally (time) related data may be LBAs that were written around the same time as LBA 1001.

Figure 12:
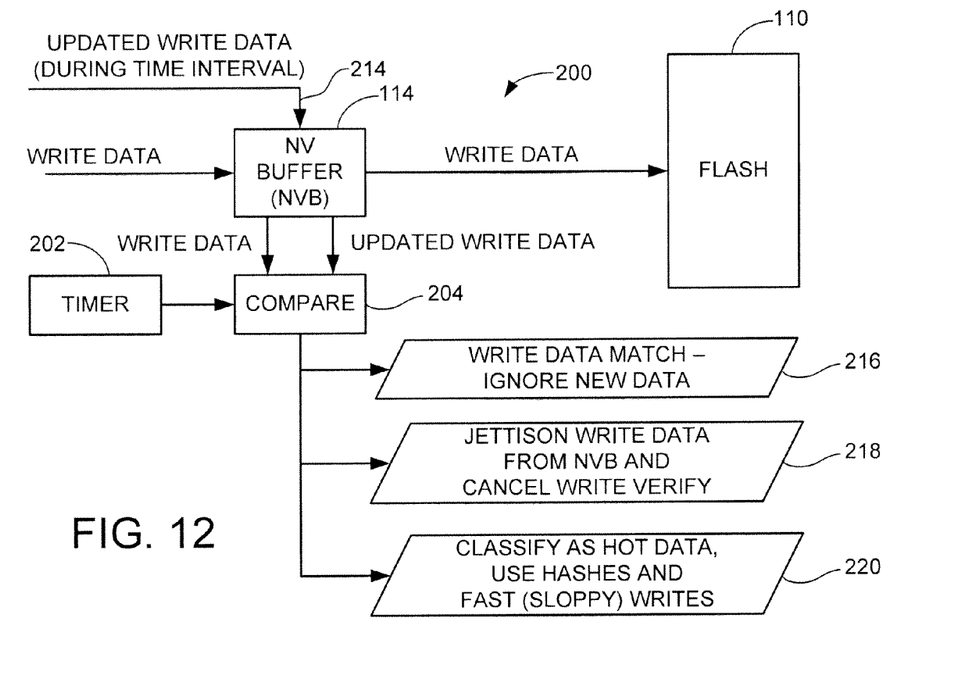
FIG. 12 illustrates a comparison operation carried out by the device of FIG. 2 in accordance with some embodiments.

FIG. 12 shows a related sequence of operations that may be carried out by the data management circuit 200. As before, write data for LBA 1001 are received from the host, stored in the NV buffer 114 and copied over to the main flash memory array 110. At this point the timer circuit 202 begins counting the elapsed time interval and a verify operation is scheduled to occur once the time interval is completed.

Prior to the completion of the elapsed time interval, however, a new write request is received from the host for the data associated with LBA 1001, as denoted by path 214. At this point, the circuit 200 determines whether the new write data are different from the existing write data in the NV buffer. The comparison circuit 204 compares the two data sets in a manner similar to the comparison discussed above in FIG. 11. A number of different possible processing paths may be taken.

As shown by step 216, if the two data sets match, then the host device has simply provided another write request for the same data, and the new data can be ignored. Avoiding the writing of duplicate sets of the same data (write amplification) can advantageously reduce the expenditure of time and system resources, and can reduce wear.

If the two data sets do not match, as shown by step 218 the older version of the write data for LBA 1001 is jettisoned from the NV buffer 114, the timer circuit countdown is discontinued, and the verify operation is cancelled. The new set of write data for LBA 1001 is thereafter processed as discussed above (including a new time interval and scheduled verify operation).

Additional processing may be applied at step 220. Because multiple write requests have been received from the host in a relatively short period of time, the data can be classified as "hot" data as before. In this case, subsequently received sets of the hot write data may be processed using hashes and/or fast (sloppy) writes.

Figure 13:
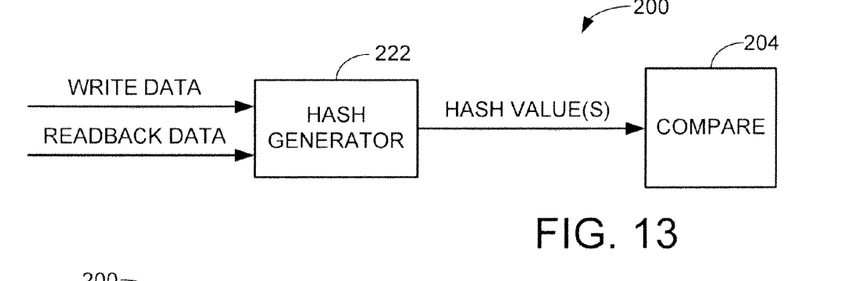
FIG. 13 depicts generation of hash values by the device in accordance with further embodiments.

A hash generator 222 is shown in FIG. 13. Generally, the hash generator 222 uses a hash function to generate a set of hash values from a set of input data. A hash function can be characterized as any number of different types of algorithms that map a first data set (a "key") of selected length to a second data set (a "hash value") of selected length. In many cases, the second data set will be shorter than the first data set. The hash functions used by the hash generator 22 should be transformative, referentially transparent, and collision resistant.

Transformation relates to the changing of the input value by the hash function in such a way that the contents of the input value (key) cannot be recovered through cursory examination of the output hash value. Referential transparency is a characteristic of the hash function such that the same output hash value will be generated each time the same input value is presented. Collision resistance is a characteristic indicative of the extent to which two inputs having different bit values do not map to the same output hash value. The hash function or functions used by the hash generator 222 can take any number of forms, including checksums, check digits, fingerprints, cryptographic functions, parity values, etc.

In some embodiments, a Sha series hash function, such as a Sha 256 hash is applied. Selected bits of the Sha 256 hash, such as the least significant bits of the Sha hash value, etc., can also be used as the hash value.

The hash generator 222 can be configured to generate hash values as required by the system. As shown in FIG. 13, during the subsequent writing of the updated write data from FIG. 12, a hash value is generated and stored with the copy of the updated write data in the flash memory array 110. During a subsequent verify operation, a comparison takes place as discussed above in FIG. 11. Instead of comparing the complete sets of input write data and readback data, however, the associated hash values are compared instead by the comparison circuit 204. In this way, an efficient comparison can be carried out to verify the successful writing of the data to the flash memory array 110.

Figure 14:
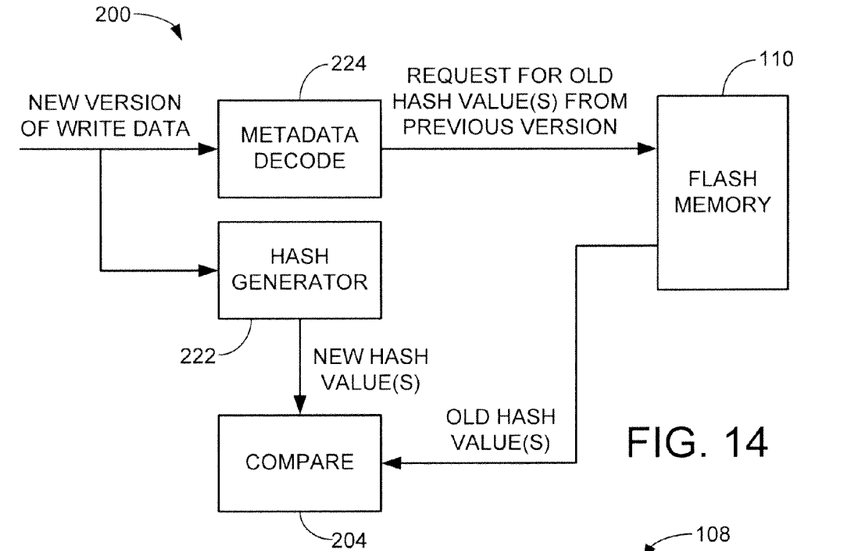
FIG. 14 shows use of hash values generated by the circuitry of FIG. 13 in accordance with some embodiments.

Hash values can further be used to reduce write amplification as set forth in FIG. 14 during write reject processing. In FIG. 14, a new version of the write data for the selected LBA (i.e., LBA 1001) is received for writing to the flash memory array 110, and is temporarily buffered in the NV buffer 114. A metadata decode circuit 224 accesses the metadata stored in the flash memory array 110 to identify the location of the previously stored data for the selected LBA and returns the previously stored (old) hash value.

The hash generator 222 generates a new hash value for the input write data, and the comparison circuit 204 compares the new hash value with the old hash value. If the hash values match, there is a statistically significant probability that the new version of the write data is merely a copy of the existing data. At this point, the new write data may be jettisoned as before since there is no need to store a new, duplicate copy of the same data. If further assurance levels are required during the write reject process, the operation can continue by retrieving the previously stored data and performing a full, bit-by-bit comparison using an XOR function or similar, as discussed above in FIG. 11.

By implementing hash values for hot write data (data in which write requests are received during the pendency of a verify operation), fast rejects of duplicate data can be carried out and write amplification can be reduced.

Figure 15:
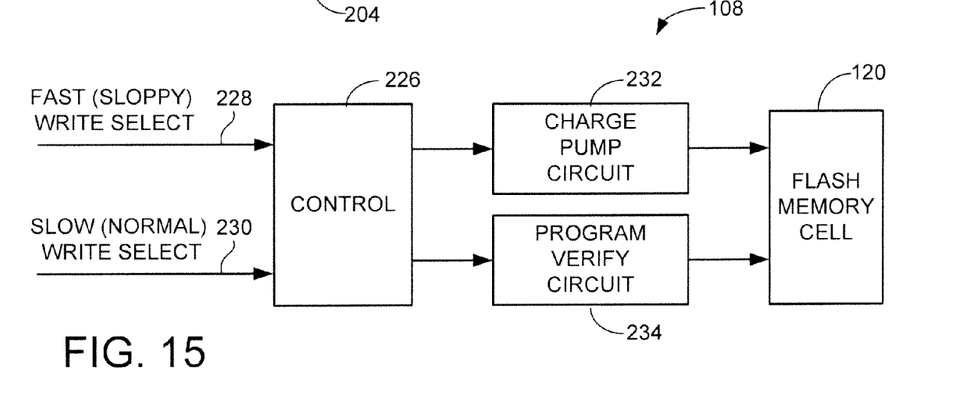
FIG. 15 represents the use of different write modes for data in accordance with some embodiments.

FIG. 15 illustrates the use of sloppy writes, which can further be implemented for hot write data during subsequent write operations. As shown in FIG. 15, the R/W/E circuit 108 includes a control circuit 226 adapted to receive a number of inputs, including a fast (sloppy) write select signal via path 228 and a slow (normal) write select signal via path 230. These signals can be generated and output by the data management circuit 200 as required. The default setting is the slow (normal) write process.

The circuit 108 is further shown in FIG. 15 to include a charge pump circuit 232 and a program verify circuit 234. These circuits 232, 234 are under the control of the control circuit 226. The charge pump circuit 232 generally operates to transfer quanta of charge to the associated flash memory cell 120 being programmed. The program verify circuit 234 periodically applies a read verify threshold to assess the total amount of charge that has been accumulated onto the floating gate 128 (FIG. 3) of the cell 120.

In the slow (normal) write select mode, the circuits 232, 234 operate in a normal fashion to apply charge to the flash memory cell. In some cases, this may include the accumulation of charge from a voltage source onto a storage device, such as a capacitor, and the transfer of the charge to the cell 120 via the associated bit and word lines (FIG. 4) to incrementally increase the amount of accumulated charge on the floating gate. The program verify circuit may operate at the conclusion of each charge transfer operation to assess the total amount of accumulated charge by the cell 120. A first, normal set of process parameters, such as thresholds, may be applied to ensure the total amount of charge on the programmed cell falls within a selected range.

During the fast (sloppy) write select mode, the circuits 232, 234 operate as above, except in a faster, less controlled manner. A number of techniques can be applied to speed up the programming process at the expense of precision. The charge pump circuit, for example, can be configured to transfer greater amounts of charge during each transfer than during the normal operation, and/or can transfer a larger number of charge sets in succession before being evaluated by the program verify circuit 234.

Moreover, the program verify circuit 234 may use a second set of relaxed parameter thresholds when adjudging whether the programming operation has been completed. It is contemplated that the sloppy write process will tend to write data faster than the normal write process, and potentially with a lower draw of overall power, but the finally programmed cells will tend to exhibit greater charge distribution variations as compared to the same cells programmed using the normal process.

It will be appreciated that one basis for using sloppy writes for hot write data is the expectation that the duration of the data in the flash memory array 110 may be substantially shorter than for normal data. Accordingly, the system may be able to tolerate the short term storage of data with greater charge distribution variations.

Figure 16:
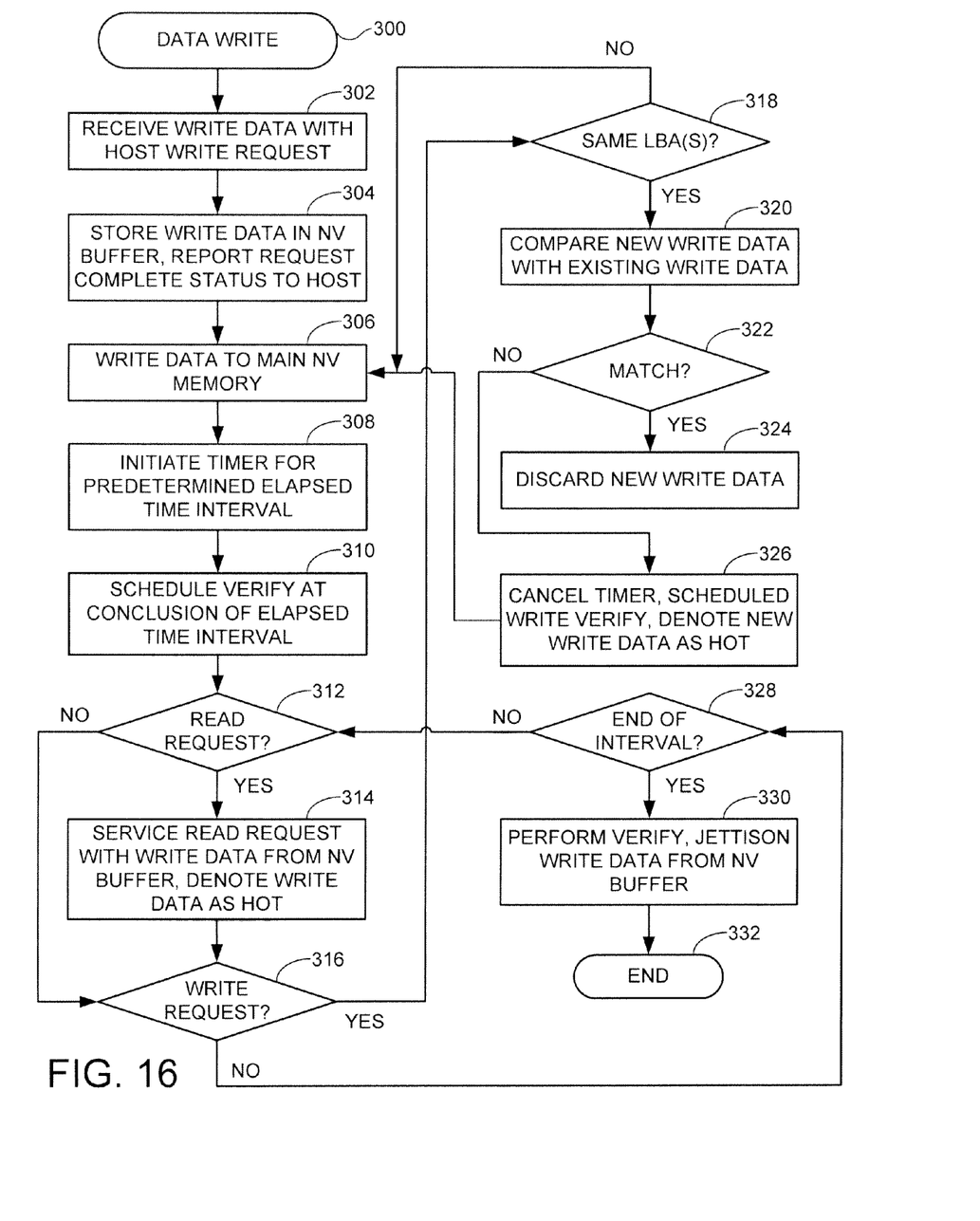
FIG. 16 is a DATA WRITE routine generally representative of steps that can be carried out in accordance with various embodiments of the present disclosure.

FIG. 16 sets forth a DATA WRITE routine 300, generally illustrative of steps that may be carried out by the device 100 in accordance with the foregoing discussion during the processing of write data. Write data, such as the write data for LBA 1001 discussed above, are received in conjunction with a write request (command) from a host device at step 302. The input write data are stored in a rewriteable, non-volatile (NV) buffer such as 114 at step 304. Writeback processing may be employed so that the host is notified that the data have been successfully written at this point.

The routine proceeds to step 306 where the write data are copied from the NV buffer to an NV main memory, such as the flash memory array 110. A timer circuit, such as 202, is initiated at step 308 to initiate a predetermined elapsed time interval. It will be noted that the timer circuit may operate as a counter to measure passage of a preselected amount of time. Alternatively, the timer circuit may count intervening access commands received by the device from the host and conclude the time interval once a predetermined number X of access commands (such as X=10, etc.) have been received (and, as desired, processed). A verify operation is scheduled at step 310 for the data written in step 306, the verify operation to tentatively take place once the elapsed time interval has concluded.

The routine next processes events, if any, that occur during the course of the elapsed time interval. Decision step 312 inquires whether a read request for the write data (e.g., LBA 1001) has been received. If so, the process passes to step 314 where the read request is satisfied as a cache hit from the NV buffer 114, and the write data are denoted as hot data for future processing. At this point, or later in the process, spatially or temporally adjacent data may be migrated to the NV buffer 114 for future cache hits. Moreover, a cache retention policy may be enacted such that the data remain in the NV buffer 114 after successful conclusion of the verify operation.

Continuing with the routine, the flow passes to decision step 316 which inquires whether a write request is received during the time interval. If so, the routine passes to step 318 which determines whether the new write request is for the same data (e.g., for LBA 1001) or whether the new write request is for a different set of data. In the latter case, the routine passes back to step 306 and the new set of data are written and a new elapsed time interval is initiated for the new data. It is contemplated that the timing circuit 202 can concurrently manage any number of different, overlapping elapsed time intervals for any number of data sets.

If the new write data has the same logical address as the pending write data (e.g., both are for LBA 1001), the routine passes from step 318 to step 320 where a comparison is made between the respective sets of data. This was discussed above in FIG. 12. If the two data sets match, decision step 222, then the new write data can be discarded as unnecessary, step 324.

If the sets of write data do not match, then it can be presumed that the new set of write data are updated data, or most current version data, and the older set of data are now stale, older version data. In such case, there is no further need to perform a write verification of the older data. The routine passes to step 326 where the current time interval is discontinued, the scheduled verify operation from step 310 is cancelled, and the new write data are denoted as hot data. This may entail the use of hash values and/or sloppy writes for subsequent write operations for the associated LBA(s), as discussed above in FIGS. 13-15.

On the other hand, if no read request (step 312) and no write request (step 316) is received as the elapsed time interval continues to pass, the routine passes to decision step 328 which determines whether the elapsed time interval has completed. If not, the routine cycles back, processing any received read and/or write requests as necessary.

At some point the elapsed time interval will have concluded, at which point the process proceeds from step 328 to step 330, where the scheduled verify step is performed, as generally set forth in FIG. 11. If the write verification is successful, the write data may be jettisoned from the NV buffer, provided that no read requests were received in the interim. The process then ends at step 332, although it will be understood that multiple sets of pending write data may be concurrently subjected to the flow of FIG. 16 and processed accordingly.

It will now be appreciated that the various embodiments presented herein can provide a number of benefits. The use of an NV buffer to temporarily buffer input write data may help to reduce data loss in the event of power loss or other anomalous event. The use of a timer to delay a write verification process can enable the system to schedule the verify operation at a more convenient time, as well as to determine, based on intervening read and/or write requests, the relative status of the data (e.g., whether the data may be viewed as hot read data and/or hot write data). Indeed, the delay allows unnecessary verify operations from being performed if updated data for a given logical address are received during the time interval.

The denoting of certain data as hot data (whether hot read data or hot write data) further allows the implementation of suitable caching policies and write strategies, such as speculative read pulls, the use of hash values and the use of fast (sloppy) writes. Write amplification can be reduced, which may tend to increase effective data I/O rates and reduce wear on the NV main memory.

Although not necessarily limiting, it is contemplated that a rewriteable NV buffer, such as but not limited to RRAM, STRAM, PCRAM, etc. can advantageously extend the operational performance of an NV main memory made of a different construction, such as erasable flash memory. Other types of buffer and main memory can be used.

Numerous characteristics and advantages of various embodiments of the present disclosure have been set forth in the foregoing description, together with structural and functional details. Nevertheless, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   storing input write data in a non-volatile (NV) buffer, the input write data having an associated logical address;
   transferring a copy of the input write data to an NV main memory while retaining the stored input write data in the NV buffer;
   initiating a count to denote a predetermined elapsed time interval; and
   performing a verify operation at responsive to the conclusion of the predetermined elapsed time interval to verify successful transfer of the copy of the input write data to the NV main memory.

2. The method of claim 1, in which the NV buffer is a rewriteable solid-state memory and the NV main memory is an eraseable solid-state memory.

3. The method of claim 2, in which the rewriteable solid-state memory is a selected one of a spin-torque random access memory (STRAM), resistive random access memory (RRAM) or a phase change random access memory (PCRAM), and the erasable solid-state memory is a flash memory.

4. The method of claim 1, in which the verify operation of the performing step is carried out responsive to an absence of an intervening write request associated with the input write data in the NV buffer during the predetermined elapsed time interval, and wherein responsive to the presence of an intervening write request associated with the input write data in the NV buffer, the verify operation is not performed.

5. The method of claim 1, further comprising transferring a copy of the input write data to a host device from the NV buffer responsive to a read request received during the elapsed time interval and prior to the verify operation, and implementing a change in cache retention policy to retain the input write data in the NV buffer after the verify operation is successfully concluded.

6. The method of claim 5, further comprising transferring a second set of data spatially and/or temporarily related to the input write data to the NV buffer responsive to the read request as a speculative data pull.

7. The method of claim 1, in which the method further comprises receiving, prior to a conclusion of the predetermined elapsed time interval, a second set of input write data having the associated logical address different from the input write data in the NV buffer, and repeating the storing, transferring, initiating and performing steps for the second set of input write data, wherein the verify operation is not performed for the input write data in the NV buffer.

8. The method of claim 1, further comprising generating a hash value using a selected hash function responsive to the input write data, storing the hash value in the NV main memory, and using the stored hash value in a subsequent write reject process involving receipt of a second set of input write data sharing the associated logical address.

9. The method of claim 1, further comprising writing the input write data using a sloppy write process responsive to a frequency of receipt of sets of input write data sharing the associated logical address.

10. The method of claim 1, wherein the predetermined elapsed time interval is a preselected, fixed amount of elapsed time so that the predetermined elapsed time interval ends upon passage of the preselected, fixed amount of elapsed time after initialization of a timer.

11. The method of claim 10, wherein the preselected, fixed amount of elapsed time is selected to exceed a relax time interval associated with the non-volatile main memory.

12. The method of claim 10, wherein the predetermined elapsed time interval is a variable amount of elapsed time which ends responsive to receipt of X access commands from a host device after the transfer of the input write data to the NV main memory, where X is a plural integer.

13. An apparatus comprising:
a non-volatile (NV) buffer adapted to store input write data having a selected logical address;
a write circuit adapted to transfer a copy of the input write data to an NV main memory while retaining the stored input write data in the NV buffer;
a timer circuit adapted to initiate a count to denote a predetermined elapsed time interval responsive to the transfer of the copy of the input write data to the NV main memory; and
a verify circuit adapted to perform a verify operation at the conclusion of the predetermined elapsed time interval to verify successful transfer of the copy of the input write data to the NV main memory.

14. The apparatus of claim 13, in which, responsive to receipt during the elapsed time interval of updated input write data having the selected logical address, the verify circuit cancels the verify operation, the NV buffer stores the updated input write data, and the write circuit transfers a copy of the updated input write data to the NV main memory.

15. The apparatus of claim 14, further comprising a hash generator which generates a hash value responsive to the updated input write data, the write circuit storing the generated hash value in the NV main memory.

16. The apparatus of claim 15, in which the verify circuit performs a verify operation upon the updated input write data responsive to a comparison of the generated hash value in the NV main memory and a second generated hash value generated responsive to the updated input write data in the NV buffer.

17. The apparatus of claim 13, further comprising a read circuit which, responsive to receipt of a read request requesting data having the selected logical address, transfers a copy of the input write data for output to a host from the NV buffer and implements a cache retention policy to retain the input write data in the NV buffer after a successful conclusion of the verify operation.

18. The apparatus of claim 13, in which the read circuit further transfers a copy of a second set of data spatially and/or temporarily related to the input write data to the NV buffer responsive to the read request as a speculative data pull.

19. The apparatus of claim 13, in which the NV main memory comprises a flash memory comprising a plurality of flash memory cells, and the write circuit further comprises a charge pump which stores the copy of the input write data to a selected set of the flash memory cells by storing accumulated charge on a floating gate structure of the selected set of the flash memory cells.

20. The apparatus of claim 19, in which the charge pump is adapted to alternatively store said accumulated charge in accordance with a fast, sloppy write process and in accordance with a slow, normal write process, and in which the charge pump stores said accumulated charge using the fast, sloppy write process responsive to a control signal indicating classification of the input write data as hot data.

21. The apparatus of claim 13, in which the NV buffer is a rewriteable solid-state memory and the NV main memory is an eraseable solid-state memory.

22. The apparatus of claim 13, in which the timer circuit denotes the predetermined elapsed time interval in terms of passage of a preselected amount of elapsed time.

23. The apparatus of claim 13, wherein the timer circuit concludes the predetermined elapsed time interval responsive to receipt of X access commands from a host device, where X is a plural integer.

24. The apparatus of claim 13, in which the predetermined elapsed time interval is varied in relation to a workload rate of received access commands.

25. An apparatus comprising:
a non-volatile (NV) buffer comprising a plurality of rewriteable non-volatile memory cells arranged as a content addressable memory (CAM) and adapted to store input write data having a selected logical address;
an NV main memory comprising a plurality of eraseable flash memory cells;
a write circuit adapted to transfer a copy of the input write data to the NV main memory while retaining the stored input write data in the NV buffer;
a timer circuit adapted to initiate demarking a predetermined elapsed time interval; and
a verify circuit which, responsive to receipt during the predetermined elapsed time interval of updated write data having the selected logical address, instructs the timer circuit to discontinue demarking of the predetermined elapsed time interval and reinitializes the timer circuit to commence demarking a second predetermined elapsed time interval for the updated write data, and wherein the verify circuit, responsive to an absence during the predetermined elapsed time interval of updated write data having the selected logical address, performs a verify operation at the conclusion of the predetermined elapsed time interval to verify successful transfer of the copy of the input write data to the NV main memory.

* * * * *

UNITED STATES PATENT AND TRADEMARK OFFICE
CERTIFICATE OF CORRECTION

| | | |
|---|---|---|
| PATENT NO. | : 9,076,530 B2 | Page 1 of 1 |
| APPLICATION NO. | : 13/762033 | |
| DATED | : July 7, 2015 | |
| INVENTOR(S) | : Kevin Arthur Gomez et al. | |

It is certified that error appears in the above-identified patent and that said Letters Patent is hereby corrected as shown below:

Claims

In Col. 12, line 44 claim 1,
delete "at"

Signed and Sealed this
Twelfth Day of April, 2016

Michelle K. Lee
*Director of the United States Patent and Trademark Office*